United States Patent [19]

Gaku et al.

[11] Patent Number: 4,740,343

[45] Date of Patent: Apr. 26, 1988

[54] METHOD FOR PRODUCING RIGID RESIN MOLDS

[75] Inventors: Morio Gaku, Saitama; Hidenori Kimbara, Tokyo; Jun Yokoi, Tokyo; Yasunari Osaki, Tokyo; Mitsuru Nozaki, Tokyo, all of Japan

[73] Assignee: Mitsubishi Gas Chemical Company, Inc., Tokyo, Japan

[21] Appl. No.: 29,581

[22] Filed: Mar. 25, 1987

Related U.S. Application Data

[63] Continuation-in-part of Ser. No. 852,212, Apr. 15, 1986, abandoned.

[30] Foreign Application Priority Data

Apr. 17, 1985 [JP] Japan ................................. 60-81595
Sep. 10, 1985 [JP] Japan ............................... 60-198468
Jan. 14, 1986 [JP] Japan .................................. 61-4212

[51] Int. Cl.$^4$ ...................... B29C 33/40; B29C 39/02; C08K 3/08; C08L 63/00
[52] U.S. Cl. .................................... 264/225; 264/104; 264/219; 264/236; 523/457; 524/434; 524/439; 524/500; 524/524; 524/540
[58] Field of Search ...................... 249/134, 135, 127; 264/219, 225, 104, 236; 523/457, 458, 459; 524/439, 440, 441, 457, 458, 459, 500, 524, 540, 434, 435, 437

[56] References Cited

U.S. PATENT DOCUMENTS

| | | | |
|---|---|---|---|
| 3,427,689 | 2/1969 | Windecker | 264/219 |
| 3,674,589 | 7/1972 | Schaab | 264/104 |
| 3,737,266 | 6/1973 | Yamamoto | 425/141 |
| 4,374,076 | 2/1983 | Stephan et al. | 264/225 |
| 4,396,745 | 8/1983 | Ikeguchi | 525/374 |
| 4,410,666 | 10/1983 | Ikeguchi et al. | 525/417 |
| 4,466,936 | 8/1984 | Schapel | 264/225 |
| 4,499,245 | 2/1985 | Ikeguchi et al. | 525/417 |
| 4,506,053 | 3/1985 | Sakurai et al. | 524/405 |
| 4,533,727 | 8/1985 | Gaku et al. | 528/361 |
| 4,552,690 | 11/1985 | Ikeguchi | 252/512 |
| 4,554,346 | 11/1985 | Gaku | 528/363 |
| 4,576,768 | 3/1986 | Markert et al. | 264/236 |
| 4,645,784 | 2/1987 | Lalancette | 524/441 |
| 4,675,358 | 6/1987 | Frangou | 524/439 |

FOREIGN PATENT DOCUMENTS 3423385 11/1984 Fed. Rep. of Germany .
3426883 5/1985 Fed. Rep. of Germany .

OTHER PUBLICATIONS

Encyclopedia of Polymer Science and Technology (Plastics, Resins, Rubbers, Fibers); vol. 3: Casting to Cohesive-Energy Density 1966.

*Primary Examiner*—James Lowe
*Assistant Examiner*—J. F. Durkin, II
*Attorney, Agent, or Firm*—Browdy and Neimark

[57] ABSTRACT

A method for producing a rigid resin mold for preparing plastic moldings which comprises:
(1) preparing a composition (I) consisting essentially of
 (A) a cyanate ester resin composition, and
 (B-1) a metallic substance which does not substantially accelerate gelation of the cyanate ester resin composition (A),
(2) preparing a composition (II) consisting essentially of
 (C) epoxy resin, and
 (B-2) a metallic substance which accelerates gelation of the cyanate ester resin composition (A) and does not substantially accelerate gelation of the epoxy resin (C) at temperatures below or equal to 100° C.,
(3) mixing composition (I) of step (1) and composition (II) of step (2) to form composition (III),
(4) casting composition (III) of step (3) into a mold
(5) and gelling the cast resin.

6 Claims, No Drawings

METHOD FOR PRODUCING RIGID RESIN MOLDS

This application is a C-I-P Application of U.S. Ser. No. 852,212 filed April 15, 1986, now abandoned.

BACKGROUND OF THE INVENTION

The present invention relates to a rigid resin mold that is merely called bried mold for preparing resin moldings. More particularly, the present invention relates to a method for producing a rigid resin mold that has high heat resistance, abrasion resistance and thermal conductivity and which is easy to handle in the process involving the steps of preparing two kinds of thermosetting resin compositions in a fluid state, mixing them, casting a molten resin, gelling the resin, and subsequently after-curing it at a higher temperature for the purpose of curing the same.

Conventionally, rigid resin molds are produced by curing, at ambient temperature, an epoxy resin which is mixed with a metal powder or fiber, a curing agent (e.g. tertiary amine or acid anhydride), and with a curing catalyst. In order to improve the limited resistance of epoxy resins to heat and moisture, the use of highly heat-resistant epoxy resins such as polyfunctional epoxy resins has been proposed. But such epoxy resins per se are very brittle and are unable to withstand the handling encountered in practical operations. In order to solve this problem, mixing a flexible materials in epoxy resins is essential, but then it is impossible to provide a product having adequately improved heat resistance.

SUMMARY OF THE INVENTION

The present inventors made concerted efforts to develop a process for producing a rigid hard resin mold that exhibits superior thermal resistance compared with the prior art rigid resin molds and which yet retains high thermal conductivity, high abrasion resistance and good working and handling properties. As a result, the inventors have found that this object can be attained by using a cyanate ester resin composition as a binder resin, and in combination with a curing agent composition which is mixture of an epoxy resin and a metal which serves as a catalyst for said binder resin.

This invention relates to a method for producing a rigid resin mold for preparing plastic moldings which comprises:

(1) a step of preparing a composition (I) consisting essentially of
   (A) 25 –75 parts by weight of a cyanate ester resin composition which has a melting point of less than 100° C., and
   (B-1) 75 –25 parts by weight of a metallic substance which does not substantially accelerate gelation of the cyanate ester resin composition (A),
(2) a step of preparing a composition (II) consisting essentially of
   (C) 15 –75 parts by weight of epoxy resin having a melting point of less than 80° C., and
   (B-2) 85 –25 parts by weight of a metallic substance which accelerates gelation of the cyanate ester resin composition (A) and does not substantially accelerate gelation of the epoxy resin (C) at temperatures below or equal to 100° C.,
(3) a step of mixing composition (I) of step (1) and composition (II) of step (2) to form composition (III) having fluidity at a temperature of less than 100° C.,
(4) a step of casting composition (III) of step (3) into a mold at a temperature of less than 100° C.,
(5) a step of gelling the cast resin at a temperature of 60°–150° C. to form self-sustaining solid, and
(6) a step of withdrawing the gelled resin from the mold and heating it at a temperature of 150°–240° C. which is higher than the gelation temperature of step (5).

DETAILED DESCRIPTION OF THE INVENTION

By the "rigid resin mold", or "brief mold" in the specification and claim is meant a resin mold or die which can be made at low cost and within a short period without using a special machine tool. That is, the "brief mold" means a mold made of a resin, or a mold, a cavity portion of which is made of a resin. The brief molds are used for preparing a variety of moldings from a general-purpose plastic, a general-purpose engineering plastic or a super engineering plastic.

Molded shapes in the order of several hundreds several–several thousands can be produced by using a brief resin mold.

The cyanate ester thermosetting resin composition (A) is selected from the known polyfunctional cyanate ester resin components containing a cyanate ester component of the formula (1) as an essential component. Examples of the cyanate ester resin compositions include a cyanate ester resin (U.S. Pat. Nos. 3,553,244; 3,755,402 and 3,740,348 and DE Pat. Nos. 1,190,184 and 1,195,764), cyanate estermaleimide resin, cyanate ester-maleimide-epoxy resin (U.S. Pat. No. 4,110,364 and DE Pat. No. 2,512,085) and cyanate ester-epoxy resin (U.S. Pat. No. 3,562,214 and DE Pat. No. 1,720,663)

Cyanate Ester Resin

Cyanate ester resin composition (A) having a melting point of less than 100° C. includes a cyanate resin selected from the group consisting of (i) a polyfunctional cyanate ester represented by the formula:

$$R(OCN)_m \qquad (1)$$

wherein R is an organic aromatic radical, preferably an aromatic nucleus-containing residue having 1 –10 benzene rings selected from the group consisting of a residue derived from an aromatic hydrocarbon selected from the group consisting of benzene, biphenyl and naphthalene, residue derived from a compound in which at least two benzene rings are bonded to each other by a bridging member selected from the group consisting of

wherein $R^1$ and $R^2$ are the same or different and each represents a hydrogen atom or an alkyl group containing 1 to 4 carbon atoms,

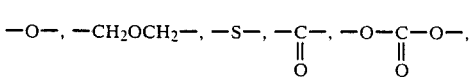

-continued

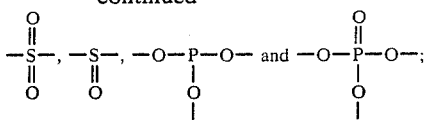

said aromatic nucleus is optionally substituted by a substituent selected from the group consisting of alkyl groups containing 1 to 4 carbon atoms, alkoxy groups, containing 1 to 4 carbon atoms, chlorine and bromine; and m is an integer of at least 2 and preferably 2–10, and the cyanato group is always directly bonded to the aromatic nucleus.

(ii) a prepolymer of (i), and (iii) a coprepolymer of (i) and an amine. These cyanate resins are given in U.S. Pat. Nos. 3,553,244; 3,755,402 and 3,740,348 and DE Pat. Nos. 1,190,184 and 1,195,764 which is incorporated herein by reference.

The cyanate ester resin composition may contain other thermosetting resins. Cyanate ester-maleimide resin and cyanate ester-maleimide-epoxy resin (U.S. Pat. No. 4,110,364 and DE Pat. No. 2,512,085) and cyanate ester-epoxy resin (U.S. Pat. No. 3,562,214 and DE Pat. No. 1,720,663) may also be used as the cyanate ester resin composition (A).

Examples of the polyfunctional cyanate ester compounds include 1,3- or 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4dicyanatophenyl)methane; 2,2-bis(4-cyanatophenyl)propane, 2,2-bis(3,5-dichloro-4-cyanatophenyl)propane, 2,2-bis(3,5-dibromo-4-cyanatophenyl)propane; bis(4-cyanathophenyl)ether; bis(4-cyanatophenyl)thioether; bis(4-cyanatophenyl)sulfone; tris(4-cyanatophenyl)phosphite; tris(4-cyanatophenyl)phosphate; bis(3-chloro-4-cyanatophenyl)methane; a cyanate ester obtained by reacting a novolak with a halogenated cyanide (U.S. Pat. Nos. 4,022,755 and 3,448,079 and DE Pat. Nos. 2,533,322 and 1,251,023), and cyanate ester obtained by reacting a bisphenol type polycarbonate and a halogenated cyanide (U.S. Pat. No. 4,026,913 and DE Pat. No. 2,611,796). Other cyanate ester compounds employed in the practice of this invention are given in U.S. Pat. Nos. 3,553,244; 3,755,402; 3,740,348; 3,595,900; 3,694,410; 4,097,455 and 4,116,946 and British Pat. Nos. 1,305,967 and 1,060,933 which are incorporated herein by way of reference.

A prepolymer having a cyanato group in its molecule which is prepared by polymerizing the above cyanate ester compounds in the presence or absence of, as a catalyst, an acid such as a mineral acid or Lewis acid, or a salt such as sodium carbonate or lithium chloride, or phosphate esters, such as tributyl phosphine, can be used as a cyanate ester compound.

Homoprepolymer of the above cyanate ester and coprepolymer of the above cyanate ester and an amine may be used as a cyanate ester compound. Examples of the amines include meta- or para-phenylenediamine, meta- or para-xylylenediamine, 1,4- or 1,3-cyclohexanediamine, hexahydroxylylenediamine, 4,4'-diaminobiphenyl, bis(4-aminophenyl)methane, bis(-4aminophenyl)ether, bis(4-aminophenyl)sulfone, bis(4-amino-3-methylphenyl)methane, bis(4-chloro-4-aminophenyl)methane, bis(4-amino-3,5-dimethylphenyl)methane, bis(4-aminophenyl)cyclohexane, 2,2-bis(4-aminophenyl)propane, 2,2-bis(4-amino-3-methylphenyl)propane, 2,2-bis(3,5-dibromo-4-aminophenyl)propane, bis(4-aminophenyl)phenylmethane, 3,4-diaminophenyl-4'-aminophenylmethane and 1,1-bis(4-aminophenyl)-1-phenylethane, bis(4-aminophenyl)diphenyl silane, bis(4-aminophenyl)methyl phosphoneoxide, bis(4-aminophenyl)methyl phosphoneoxide, bis(4-aminophenyl)-phenyl phosphoneoxide, 2,4-diamino-6-phenyl-1,3,5-triazine(benzoguanamine), methylguanamine and butylguanamine.

Mixtures of two or three of the cyanate ester monomer, the homoprepolymer of the cyanate ester and the coprepolymer of the cyanate ester and an amine may be used. The number average molecular weight of the mixture may be in the range of 280–6,000, preferably 280–1,500 and most preferably 300–1,000.

The thermosetting resin composition may be cyanate ester-maleimide resin, cyanate ester-maleimide-epoxy resin (U.S. Pat. No. 4,110,364 and DE Pat. No. 2,512,085) and cyanate ester-epoxy resin (U.S. Pat. No. 3,562,214 and DE Pat. No. 1,720,663)

Maleimido

The preferable maleimide is represented by the following general formula:

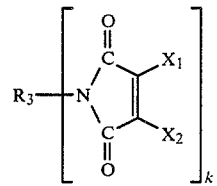

(2)

wherein $R_3$ represents an aromatic, alicyclic or aliphatic organic group having a valence of k, $X_1$ and $X_2$ are the same or different and are independently a hydrogen atom, halogen atom or lower alkyl group and n is an integer of at least 2 and preferably an integer of 2–5. Oligomers or prepolymers derived from the above maleimide compounds may be used as the maleimide compound. Polyvalent, aromatic or aliphatic organic groups represented by $R_3$ in formula (2) include the following:

(i) aliphatic or alicyclic hydrocarbon groups having 4–16 carbon atoms, (ii) polyvalent groups derived from aromatic hydrocarbons having benzene or naphthalene ring, such as benzene, xylene or naphthalene, (iii) polyvalent groups derived from compounds in which at least 2 benzene rings are directly bonded, such as biphenyl, (iv) aromatic ring-containing groups resulting from bonding of a plurality of benzene rings either directly or through a bridging member, represented by the formula

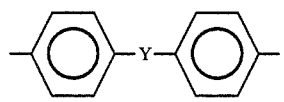

wherein Y represents a linear, branched or cyclic aliphatic hydrocarbon group having 1 to 14 carbon atoms, aromatic hydrocarbon group, such as phenylene group, a xylylene group, an oxygen atom, a sulfur atom, a carbonyl group, a sulfonyl group, a sulfinyl group, an alkyleneoxyalkylene group, a phsophonyl group, a phsophinyl group or an imino group, residues, and (v) malamine residues, and (vi) residues of polynuclear product of benzene obtained by reacting aniline with formaldehyde, generally residues of polynuclear product having 2–10 benzene rings.

The maleimides represented by the above formula (2) can be produced by a method known per se which involves reacting maleic anhydride with divalent or more polyamine having at least 2 amino groups to form a maleamide acid, and then dehydro-cyclizing the maleamide acid. The maleimide can be produced by known methods per se.

The diamines include aromatic diamines, alicyclic diamines, aliphatic diamines. Aromatic diamines are preferable, because the resulting object product has excellent heat resistance. When an alicyclic diamine is used the object products have flexibility. Primary diamines are more preferable to secondary diamines.

Examples of polyfunctional maleimides include 1,3- or 1,4-dimaleimide benzene, 1,3- or 1,4-bis(maleimide methylene)benzene, 1,3- or 1,4-dimaleimido cyclohexane, 1,3- or 1,4-bis(maleimidomethylene)cyclohexane, 4,4-dimaleimido biphenyl, bis(4-maleimidophenyl)methane, bis(4-maleimidophenyl)ether, bis(4-maleimidophenyl)sulfone, bis(4-maleimido-3-methylphenyl)methane, bis(4-maleimido-3-chlorophenyl)methane, bis(4-maleimido-3,5-dimethylphenyl)methane, 2,2-bis(4-maleimido-3-methylphenyl)propane, 2,2-bis(4-maleimido-3,5-dibromophenyl) propane, bis(4-maleimidophenyl)phenylmethane, 3,4-dimaleimidophenyl-4'-maleimidophpenylmethane, 1,1-bis(4-maleimidophenyl)-phenyl-4'-maleimidophenylmethane, 1,1-bis(4-maleimidophenyl)1-phenyl-methane, maleimides derived from melamine and maleimides derived from addition product of formalin and an aniline in which two or more benzene rings bond through methylene group.

The polyfunctional maleimide of this invention can be used in an amount of less than 25% by weight on the basis of weight of the total resin composition; and preferably, the polyfunctional maleimide can be used in an amount of less than 25% by weight on the basis of weight of the cyanate ester resin in order to carry out gelation or precure at a temperature of less than 100° C.

Metallic Substance

The metallic substance, such as a metallic powder or a metallic fiber is used for imparting thermal conductivity or gelling or curing catalyst to the resin. Examples of metallic components include aluminum, nickel, chromium, tin, zinc, silver, gold, platinum, titanium, cobalt and alloys containing one or more of these metals, stainless steel copper, iron, lead, manganese, magnesium and alloys containing one or more of these metals.

The metallic substances (B-1) and (B-2) are explained in the following:

(B-1) a metallic substance which does not substantially accelerate gelation of the cyanate ester resin composition (A) at a temperature below or equal to 100° C., and (B-2) a metallic substance which accelerates gelation of the cyanate ester resin composition (A) and does not substantially accelerate gelation of the epoxy resin (C) at a temperature below or equal to 100° C.

Examples of the metallic component (B-1) which do not substantially accelerate gelation of the cyanate ester resin at temperatures below or equal to 100° C. include aluminum, nickel, chromium, tin, zinc, silver, gold, platinum, titanium, cobalt and alloys containing one or more of these metals, and stainless steel in the form of powder or fiber. Of these metals, aluminum, zinc and alloys containing one or more of these metals and stainless steel are preferable.

Examples of the metallic filler (B-2) which accelerates gelation of the cyanate ester resin (A) and does not substantially accelerate gelation of the epoxy resin (C) at temperatures below or equal to 100° C. include copper, iron, lead, manganese, magnesium and alloys containing one or more of these metals or oxides thereof. Of these metals, copper and iron are preferable.

Epoxy Resin

The epoxy resins which are usable as one of the components of the thermosetting resin of this invention may be the ones employed as laminates, rigid resin molds or electronic materials in the prior art. Examples of the epoxy resins include bisphenol A type epoxy resin, bisphenol F type epoxy resin, phenol-novolak type epoxy resin, cresol-novolak type epoxy resin, halogenated bisphenol A type epoxy resin, halogenated phenol-novolak type epoxy resin, polyglycol type epoxy resin and alicyclic type epoxy resin. Mixtures of two or more of these epoxy resins may be used.

Resins other than cyanate ester can be used in an amount of less than 70% on the basis of the weight of the total amount of resin.

The present rigid resin molds obtained by after-curing have glass transition temperature of 160°–250° C. or more, whereas the prior molds have glass transition temperature of about 100° C. to about 150° C. So, the present molds are more excellent than the prior molds with respect to thermal resistance.

It is critical that the epoxy resins (C) employed in the present invention have a melting point of less than 80° C. Composition (II) is prepared by combining the epoxy resin (C) and the metallic substance (B-2).

Examples of the above epoxy resins having a melting point of less than 80° C. include bisphenol A type epoxy resin, bisphenol F type epoxy resin, phenol-novol type epoxy resin, cresol-novolak type epoxy resin, halogenated bisphenol A type epoxy resin, halogenated phenol-novolak type epoxy resin, polyglycol type epoxy resin and alicyclic type epoxy resin.

Curing Catalysts (C)

The metallic substance (B-2) accelerates curing the cyanate ester resin composition (A). The curing catalyst (C) may be used in order to gel and cure the resin more rapidly and completely. Known catalysts for curing the cyanate ester resin can be used in the present invention. Suitable catalysts include amines, imidazoles, organic metal salts, inorganic metal salts, and organic peroxides. Of these catalysts, an organic metal salt or a mixture of an organic metal salt and an organic peroxide is preferred.

Examples of organic metal salts include zinc naphthenate, lead stearate, lead naphthenate, zinc octoate, tin oleate, tin octoate, dibutyl tin maleate, manganese naphthenate, cobalt naphthenate, iron acetyl acetonate, and manganese acetyl acetonate.

Examples of organic peroxides include diacyl peroxides, such as benzoyl peroxide, 2,4-dichloro benzoyl peroxide, octanoyl peroxide, and lauroyl peroxide; dialkyl peroxides, such as di-t-butyl peroxide, 2,5-dimethyl- 2,5-di(t-butyl peroxy)hexene-3, and dicumyl peroxide; peroxy esters, such as t-butyl perbanzoate, t-butyl peracetate, di-t-butyl perphthalate, and 2,5-dimethyl-2,5-di(benzoyl peroxy)hexane; ketone peroxides, such as methyl ethyl ketone peroxide, and cyclohexanone peroxide; hydro peroxides, such as di-t-butyl hydroperoxide, cumene hydroperoxide, α-phenyl ethyl hydroperoxide, and cyclohexenyl hydroperoxide; peroxy ketals, such as 1,1-bis(t-butylperoxy)cyclohexane, and 1,1-bis(t-butylperoxy)-3,3,5-trimethylcyclohexane. The amount of catalyst employed may be less than 10% by weight, preferably less than 5% by weight, on the basis of the total resin composition.

Other Components

The casting thermosetting resin composition of the present invention may contain chelating agents, such as acetylacetone (for improving the storage stability of the resin composition); thermosetting resins, such as diallyl phthalate resin, unsaturated polyester resin, phenol resin, acrylic resin, urethane resin and the like, thermosetting unsaturated, lower molecular compounds, such as trimethylol propane triacrylate, triallyl isocyanurate, triacryloxy cyanurate, diallyl phthalate, or styrene (for improving the fluidity of the resin composition); or thermoplastic resins, such as thermoplastic polyurethane resin, polyolefins, saturated polyester resin and the like (for improving viscosity, adhering property, curability and/or flexibility of the resin composition).

Preparation of Rigid Resin Mold

According to the present invention, the resin rigid mold is prepared in the following:

Step (1)

Composition (I) is prepared by mixing a metallic substance (B-1) with a cyanate ester resin composition (A).

Step (2)

Composition (II) is prepared by mixing a metallic substance (B-2) with an epoxy resin (C).

Step (3)

Thermosetting resin composition (III) is prepared by mixing the composition (I) and the composition (II).

Step (4)

The thermosetting resin composition (III) is cast into a mold.

Step (5)

The composition (III) is gelled or precured in situ by heating.

Step (6)

It is withdrawn from the mold and is after-cured.
Composition (I) consists essentially of
(A) 25–75 parts by weight of a cyanate ester resin composition which having a melting point of less than 100° C., and (B-1) 75–25 parts by weight of a metallic substance which does not substantially accelerate gelation of the cyanate ester resin composition (A).
Composition (II) consists essentially of
(C) 15–75 parts by weight of epoxy resin having a melting point of less than 80° C., and (B-2) 85–25 parts by weight of a metallic substance which accelerates gelation of the cyanate ester resin composition (A) and does not substantially accelerate gelation of the epoxy resin (C) at temperatures below or equal to 100° C. The composition (II) may contain a curing catalyst (D) for the cyanate ester resin composition (A).

The blending method may be carried out by roll, Banbury mixer, Henshel mixer, extruder or other known kneaders at a temperature of 20° C. –130° C. The blending time depends on the molecular weight of the resin, the proportions of the components to be blended, and the kind of blending machine employed. In general, the time may be anywhere in the range of between 1 minute and 10 hours. In order to avoid incorporation of air into the resin composition, it is preferable to carry out vacuum-suction during the blending operation.

Composition (I) does not containing any catalyst for curing the components therein. Composition (II) does not contain any catalyst for curing the components therein, either. Therefore, the storage stability of each of compositions (I) and (II) is excellent.

The ratio of composition (I) to composition (II) mixed in Step (3) may be in the range of 25:75–95:5, and preferably 50:50–90:10. The resulting composition (III) is viscously liquid or pasty at a temperature of less than 100° C. e.g. 50°–90° C.

The present resin mold may be prepared by casting the resin composition as it is, or by casting the resin composition with a resin-inforcing material.

Appropriate casting methods include a method of casting the composition while carrying out vacuum-suction; a method for casting the composition, followed by pressurizing it; and a method for charging the pasty composition into a mold, followed by pressurizing the composition. It is preferable that the cast composition is pressurized at 0–100 kg/cm$^2$G, more preferably 0–30 kg/cm$^2$G and at 60°–180° C., more preferably 150° C. or less. Thereafter the cast composition when withdrawn from the mother mold may be cured at 150°–240° C. in an atmosphere such as an isothermal oven.

PREFERABLE EMBODIMENT OF PREPARATION OF RIGID RESIN MOLD

Preferable method for producing a rigid resin mold for preparing moldings for print circuits with many through holes is explained in the following.

Step (i)

A mold release agent selected by considering the properties of the constituent material of the model and the casting resin composition is coated over the entire surface of the model and dried, if necessary.

Step (ii)

Curable paste such as gypsum, etc. of a predetermined thickness which is generally used for making a model etc. is placed in a container being capable of being vacuum sucked and being heated. The model in Step (i) is in contact with the paste so that one side of hard pins to be mounted on the model is turned upward. Hard pins having the same diameter as that of the holes in the model are pierced through the holes and both ends of the hard pins are projected from both sides of the model. Plates encircle the periphery of the paste to take a rectangular column form (container). The paste is then cured. Further, metal pipes which serve as a medium path for cooling the mold are disposed over the cured paste-like substance.

Step (iii)

Composition (I) consisting essentially of
(A) 25–75 parts by weight of a cyanate ester resin composition which having a melting point of less than 100° C., and
(B-1) 75–25 parts by weight of a metallic substance which does not substantially accelerate gelation of the cyanate ester resin composition (A) is prepared.

Composition (II) consisting essentially of
(C) 15–75 parts by weight of epoxy resin having a melting point of less than 80° C., and
(B-2) 85–25 parts by weight of a metallic substance which accelerates gelation of the cyanate ester resin composition (A) and does not substantially accelerate gelation of the epoxy resin (C) at temperatures below or equal to 100° C.

Step (iv)

Composition (I) is mixed with composition (II) to form a composition (III) having a fluidity at temperature of less than 100° C.

Step (v)

Casting composition of step (iv) is poured into the container of step (2), and vacuum degassing or vacuum deaeration performed. The cast resin composition is heated at 0–30 kg/cm$^2$G and at 60°–180° C., preferably to 60°–150° C. to gel the resin, thereby forming self-sustaining solid material.

Step (vi)

The gelled cast resin composition and the cured paste-like substance are withdrawn from the container. The paste-like substance is removed from the resin and the model. A mold release agent is coated on the gelled cast resin and the model. Metal plates or bars having a thickness or length 1–10 mm and the same diameter holes as that of the hard pins are set at one end of the hard pins such as to reinforce the cast resin composition. The gelled resin and the model are placed in the container used in Step (ii) and metal pipes which serve as a medium path for cooling the mold are disposed thereover. The casting composition in Step (iv) of this invention is poured into the container, and vacuum degassing or vacuum deaeration performed. The casting composition is to gelled.

Step (vii)

The resulting resin mold is post-cured.

Step (viii)

The other parts are mounted on the resin mold.

The above method is based on two-stage casting, and gelation or semi-curing and fully curing. The resin mold can also be prepared by a one-stage casting.

The rigid resin mold of the present invention has an excellent heat resistance and abrasive resistance in comparison with the prior art resin molds. Since the mold of this invention is electrically conductive, its surface can be metallized by means of electrolytic plating.

The thermosetting resin composition of this invention is capable of being gelled at a temperature of less than 100° C. to form a solid material which is non-deformable at a curing temperature.

Examples of the plastic resins which can be molded by using the rigid resin mold of the present invention include a thermal resistant thermoplastic resin, such as polysulfone, polyether imide, polyether sulfone, polyphenylene sulfide or polyphenylene ether, and/or a thermoplastic resin, such as polycarbonate or polyphenylene ether and a cyanate ester resin in a proportion of 30/70–70/30 by weight, and optionally a reinforcing agent, such as glass fiber, wollastonite, calcium carbonate or mica is added to the resin components. The above-mentioned materials have resistance to soldering at 260° C.

The present invention is further illustrated by the following non-limiting Examples and Comparative Runs.

All percentages and parts in these Examples and Comparative Runs are by weight, unless otherwise specified.

EXAMPLE 1

Composition (i)-1 was prepared by blending 30 parts of 2,2-bis(4-cyanato phenyl)propane (hereinafter is referred as BPA-CN) and 70 parts of 150 mesh aluminum powder at 85° C. for 5 minutes. Composition (I)-1 was flowable and had a viscosity of 30 Pa.s at 60° C.

Curing agent (II)-1 was prepared by blending at room temperature 25 parts of bisphenol A type epoxy resin (Epikote 828 having epoxy equivalent of 184–194, Yuka Shell Epoxy Kabushiki Kaisha, hereinafter is referred to as EP 828) containing 0.03 parts of iron acetylacetonate and 75 parts of 150 mesh copper powder. Curing agent (II)-1 was flowable and had viscosity of 15 Pa.s at 60° C.

The casting composition was prepared by melt-blending 75 parts of Composition (I)-1 and 25 parts of curing agent (II)-1 at 60° C. The composition was poured at 60° C. into a container (8×8×15 cm) having an epoxy resin core (4×4×10 cm) at its center while performing vacuum de-aeration. When the resulting cast composition was left to stand in an isothermal oven (60° C.), it was heated to 80° C. due to selfheating to thereby gel. After 120 minutes, the mold was withdrawn from the container and cured at 175° C. for 5 hours in an oven.

The properties of the cured product were as follows:
Tg: 230° C.
Compression strength (normal state): 2,000 kg/cm$^2$
Compression strength (after heated at 200° C. for 2,000 hours): 1,700 kg/cm$^2$
Thermal conductivity: $1.9 \times 10^{-3}$ cal/(sec·cm·°C.)
Coefficient of linear thermal expansion: $2.0 \times 10^{-5}$ cm/cm/°C.
Curing shrinkage: $1.0 \times 10^{-3}$ cm/cm

EXAMPLE 2

Composition (I)-2 was prepared by blending 27 parts of BPA-CN, 3 parts of bis(4-maleimidophenyl)methane (hereinafter is referred to as BMI) and 70 parts of 150 mesh stainless steel powder. The procedure of Example 1 was repeated except that Composition (I)-2 was used instead of Composition (I)-1.

The resulting casting resin composition had a viscosity of 32 Pa.s at 60° C. The composition was heated to 85° C. due to self-heating. The gelation time was 50 minutes. The Tg value of the cured product was 230° C.

EXAMPLE 3

Twenty-four parts of BPA-CN and 6 parts of BMI were prepolymerized at 150° C. for 1 hour to obtain a prepolymer having a melting point of 65° C. Seventy parts of 250 mesh aluminum powder was blended with the above prepolymer and then acetylacetone (2 parts)

was added to the mixture to obtain Composition (I)-3 which was flowable at 60° C.

Curing agent (II)-2 was prepared by blending at room temperature 0.07 parts of zinc octoate, 30 parts of dimer acid type epoxy resin (Epikote 871 having a viscosity of 0.4–0.9 Pa.s at 25° C., Yuka Shell Epoxy Kabushiki Kaisha, hereinafter is referred to as EP 871), 1 part of saturated amorphous polyester resin (Polyester 011, Japan synthetic Rubber Co., Ltd.) and 70 parts of 150 mesh iron powder to obtain flowable Curing agent (II)-2.

The casting resin composition was prepared by melt-blending 70 parts of Composition (I)-3 and 30 parts of Curing agent (II)-2 at 70° C. The composition was cast in the same way as in Example 1 and left to stand in an oven (70° C.). The composition was heated to 90° C. due to self-heating to thereby gel in 30 minutes. After 60 minutes, the gelled product was withdrawn from the container and cured at 200° C. for 3 hours in an oven. The Tg of the cured product was 245° C.

EXAMPLE 4

Model of room temperature-cured silicone resin (RTV 1360, Shinetsu Chemical Co., Ltd.) was made from ABS resin mother mold. Model of another silicone resin was made from the resulting silicone resin mold.

The composition consisting of Composition (I)-3 and Curing agent (II)-2 was cast in the silicone resin mold as in Example 3, and gelled and cured.

The size of the resulting mold was compared with the original ABS resin mother mold. Shrinkage on curing of the mold was 0.05%.

EXAMPLE 5

Fabrication of Casting Mold

A glass fabric-based epoxy resin laminate sheet (50×50×2 mm) was perforated with 100 holes (0.9 mm$^\phi$) at pitches of 2.54 mm in a lattice pattern. The laminate was then coated with a fluorine-based mold release agent (Difree MS-743 of Daikin Kogyo Co., Ltd.) and dried to form a casting model.

A pasty mixture of gypsum and a vinyl acetate emulsion was laid on a plate (100×100 mm) to a thickness of 30 mm. The casting model was placed in intimate contact with the center of the plate and high-speed steel pins (0.9 mm$^\phi$×4 cm$^L$) were inserted into the holes such that they projected above the surface of the model mold by a length of 30 mm. Polycarbonate plates 5 mm thick which were provided with holes for guiding cooling copper pipes and unperforated polycarbonate plates were erected at a height of 130 mm such as to form a box, and the inner surfaces of the box were then coated with a mold release agent. Copper pipes (inside diameter 5 mm) with several U-shaped bends were installed around the pins such that the pipes were guided to the outside of the box through the guide holes.

Preparation of Casting Resin

Thirty parts of BPA-CN and 70 parts of an aluminum powder (150 mesh) were mixed in a dry state and the mixture was heated at 80° C. for 5 minutes under agitation to provide a flowable composition (hereinafter to is referred to as Composition (I)-4).

Twenty-five parts of EP 828 having 0.03 part of iron acetylacetonate was mixed with 75 parts of a copper powder (300 mesh) at room temperature to provide a flowable composition (hereinafter is referred to as Curing agent (II)-3).

Seventy-five parts of the Composition (I)-4 was mixed with 25 parts of the Curing agent (II)-3 at 60° C. in a molten state so as to provide a casting resin composition (hereinunder abbreviated as R1).

Casting

The R1 prepared as above was heated at 60° C. and poured into the casting mold until the pins were completely covered, and was degassing at 60° C., 3 MM Hg for 1 hour. The casting mold was then heated at 60° C. for 10 hours to gel the resin.

The contents were taken out from the polycarbonate box and, after removing all of the cured paste, the cast resin was replaced on the bottom of the polycarbonate box. A mold release agent of the same type as used above was coated to the inner surfaces of the polycarbonate box and all surfaces of the cast resin and the casting model. After installing cooling copper pipes, the steps of pouring, vacuum degassing and thermal gelling were carried out as above.

The mold was opened; the model was taken out from the mold; and the mold was post-cured in an oven at 180° C. for 10 hours. The cured casting resin mold had a glass transition temperature of 175° C. and a heat distortion temperature of 200° C.

The cured resin mold was worked up to form a gate and any other accessories necessary for injection molding, and fixed to a metallic frame by the casting resin composition R1.

Use in Injection Molding

The resin mold prepared as above was set in an injection molding machine and polysulfone resin (P-1700 of Union Carbide Corp.) was injection-molded to form a plastic molded shape article with through-holes for printed circuit board at a pressure of 1,200 kg/cm$^2$, a cylinder temperature of 340° C. and a molding cycle of 2 minutes, with the resin mold being cooled with water.

Fabrication of Plastic Molded Printed Circuit Board

The plastic molded shape article was immersedized in a mixture of 35% H$_2$O$_2$ (50 vol %) and 98% H$_2$SO$_4$ (50 vol %) for 10 minutes at 40° C., washed with an alkaline to neutralize the solution remaining on the surface of the shape, and then washed with water.

The washed plastic molded shape was dried, and all of its surfaces were activated with palladium by immersion in a liquid mixture of tin chloride and palladium chloride. A copper layer 20 μm was deposited on the entire surfaces of the activated plastic molded shape by electroless plating. The plastic molded shape was then treated by photoetching to provide a printed circuit board both surfaces of which were electroconductive.

EXAMPLE 6

Fabrication of Resin Mold

An acrylic resin sheet (50×30×3 mm) was perforated with 50 holes (0.7 mm$^\phi$) at pitches of 2.54 mm in a lattice pattern. The sheet was then coated with a fluorine-based mold release agent (Difree MS-743 of Daikin Kogyo Co., Ltd.) and dried to form a casting model. High-speed steel pins (0.7 mm$^\phi$) and copper pipes were installed as in Example 5. A powder mixture of BPA-CN (27 parts), BMI (3 parts), a stainless steel powder of 150 mesh (70 parts) and wax (0.5 part) was heated at 80°

C. for 5 minutes under agitation to provide a flowable composition (hereinafter is referred to as Composition (I)-5), and 75 parts of the Composition (I)-5 was mixed with 25 parts of the Curing agent (II)-3 at 60° C. in a molten state so as to provide a casting mold composition (hereinafter is referred to as R2). By repeating the procedures of Example 5 in the remaining respects, a resin mold having a glass transition point of 178° C. was fabricated.

Use in Injection Molding

The resin mold fabricated above was set in an injection molding machine and a molten charge of polyether sulfone resin (420P of ICI, USA) was injection-molded to form a plastic molded with through-holes for printed circuit board at a pressure of 1,300 kg/cm$^2$, a cylinder temperature of 350° C. and a molding cycle of 2.5 minutes, the resin mold being cooled with water.

The shaped article was processed as in Example 5 to make a printed circuit board both surfaces of which were electroconductive.

Comparative Run 1

The composition was prepared by blending 30 parts of EP 828, 70 parts of the copper powder of Example 1, 7 parts of diaminodiphenyl methane and 0.8 part of benzyl dimethyl amine (catalyst) at 80° C. for 5 minutes. The resulting composition was flowable and had a viscosity of 4 Pa.s at 80° C.

The resin mold was obtained from the above composition in the same way as in Example 1. The gelation time was 3 minutes (130° C.).

The properties of the cured product were as follows:
Tg: 140° C.
Compression strength (normal state): 2,000 kg/cm$^2$
Compression strength (after heated at 180° C. for 1,000 hours): 1,500 kg/cm$^2$

What is claimed is:

1. A method for producing a rigid resin mold for preparing plastic moldings which comprises:
(1) a step of preparing a composition (I) consisting essentially of
   (A) 25–75 parts by weight of a cyanate ester resin composition which having a melting point of less than 100° C., and
   (B-1) 75–25 parts by weight of a metallic substance which does not substantially accelerate gelation of the cyanate ester resin composition (A),
(2) a step of preparing a composition (II) consisting essentially of
   (C) 15–75 parts by weight of epoxy resin having a melting point of less than 80° C., and
   (B-2) 85–25 parts by weight of a metallic substance which accelerates gelation of the cyanate ester resin composition (A) and does not substantially accelerate gelation of the epoxy resin (C) at temperatures below or equal to 100° C.,
(3) a step of mixing composition (I) of step (1) and composition (II) of step (2), to form a composition (III) having fluidity at a temperature of less than 100° C.,
(4) a step of casting composition (III) of step (3) into a mold at a temperature of less than 100° C.,
(5) a step of gelling the cast resin at a temperature of 60°–150° C. to form self-sustaining solid, and
(6) a step of withdrawing the gelled resin from the mold and heating it at a temperature of 150°–240° C. which is higher than the gelation temperature of step (5).

2. The method of claim 1 wherein the ratio of Composition (I) and Composition (II) mixed in step (3) is in range of 25:75 to 95:5.

3. The method of claim 1 wherein the metallic substance (B-1) is selected from the group consisting of aluminum, aluminum alloys, zinc, zinc alloys, stainless steel and mixtures thereof, and the metallic substance (B-2) is selected from the group consisting of copper, copper alloys, iron, iron alloys and mixtures thereof.

4. The method of claim 1 wherein the composition (II) contains a curing catalyst (D) which accelerates gelation of the cyanate ester resin composition (A) and which does not substantially accelerate gelation of the epoxy resin (C) at a temperature below or equal to 100° C.

5. The method of claim 4 wherein the curing catalyst (D) is selected from the group consisting of organic metal salts, metal chelate compounds and mixtures thereof.

6. The method of claim 5 wherein the curing catalyst (D) is selected from the group consisting of zinc naphthenate, lead stearate, lead naphthenate, zinc octoate, tin oleate, tin octoate, dibutyl tin maleate, manganese naphthenate, cobalt naphthenate, iron acetyl acetonate, copper acetyl acetonate, cobalt acetyl acetonate, manganese acetyl acetonate and mixtures thereof.

* * * * *